(12) United States Patent
Shin

(10) Patent No.: US 8,084,350 B2
(45) Date of Patent: Dec. 27, 2011

(54) METHOD FOR MANUFACTURING SEMICONDUCTOR DEVICE

(75) Inventor: Eun-Jong Shin, Mapo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 389 days.

(21) Appl. No.: 12/325,158

(22) Filed: Nov. 29, 2008

(65) Prior Publication Data

US 2009/0142920 A1    Jun. 4, 2009

(30) Foreign Application Priority Data

Dec. 3, 2007   (KR) .................. 10-2007-0124516

(51) Int. Cl.
*H01L 21/4763* (2006.01)

(52) U.S. Cl. ........ 438/618; 438/622; 438/624; 438/629; 438/633; 438/653; 257/E21.579

(58) Field of Classification Search .................. None
See application file for complete search history.

(56) References Cited

U.S. PATENT DOCUMENTS

| | | | | |
|---|---|---|---|---|
| 6,140,226 A | * | 10/2000 | Grill et al. | 438/637 |
| 6,893,954 B2 | * | 5/2005 | Maekawa | 438/622 |
| 2002/0081854 A1 | * | 6/2002 | Morrow et al. | 438/694 |
| 2004/0067634 A1 | * | 4/2004 | Kim et al. | 438/622 |
| 2005/0224855 A1 | * | 10/2005 | Liu et al. | 257/297 |
| 2006/0105578 A1 | * | 5/2006 | Hong et al. | 438/723 |
| 2006/0148243 A1 | * | 7/2006 | Wang | 438/638 |

FOREIGN PATENT DOCUMENTS

KR  10-2003-0047075    6/2003
KR  10-2004-0084668    10/2004

* cited by examiner

*Primary Examiner* — N Drew Richards
*Assistant Examiner* — Kyoung Lee
(74) *Attorney, Agent, or Firm* — Sherr & Vaughn, PLLC

(57) ABSTRACT

A method for manufacturing a semiconductor device includes can prevent defects of a semiconductor device due to the deterioration of electro migration (EM)/stress migration (SM) properties of the device as a result of metal corrosion and void generation in burying a novolac material. Embodiments can also prevent the generation of fencing in a metal wire structure.

18 Claims, 5 Drawing Sheets

METHOD FOR MANUFACTURING SEMICONDUCTOR DEVICE

The present application claims priority under 35 U.S.C. §119 to Korean Patent Application No. 10-2007-0124516 (filed on Dec. 3, 2007), which is hereby incorporated by reference in its entirety.

BACKGROUND

Figure 1A:
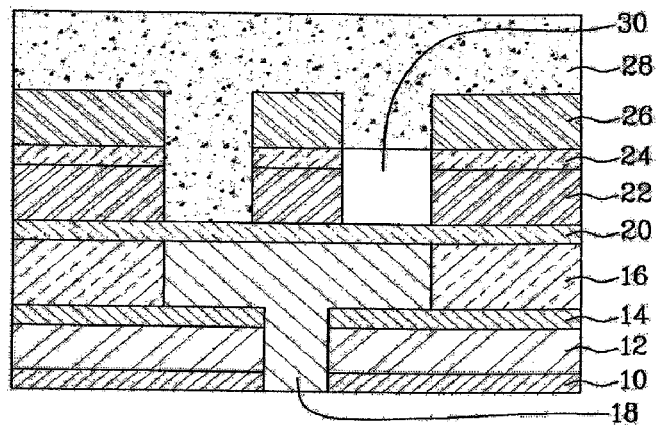
Figure 1B:
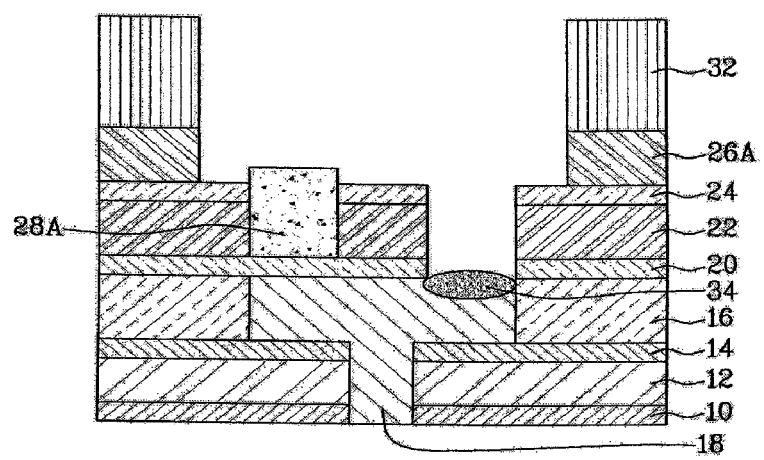
Figure 1C:
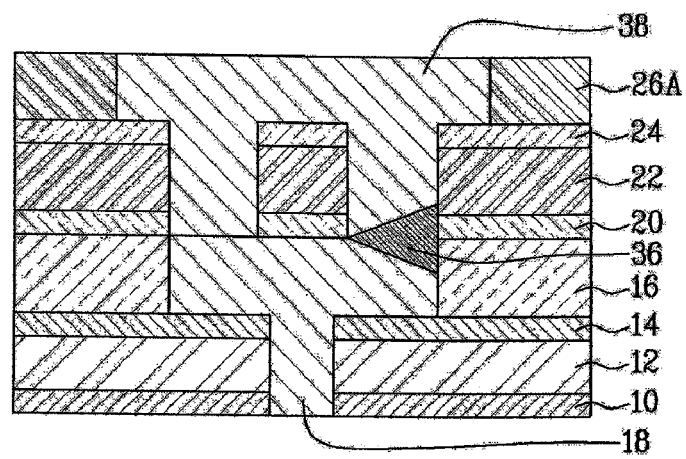

FIGS. 1A to 1C are cross-sectional views showing a method for manufacturing a semiconductor device.

As shown in FIG. 1A, lower metal wire 18 is formed passing through capping layer 10, interlayer dielectric film 12 and first etch stop film 14. First interlayer dielectric films 16 are formed on and/or over both sides of lower metal wire 18. Capping layer 10 is provided for preventing horizontal diffusion of lower metal wire 18. Second interlayer dielectric film 22 composed of a low dielectric material, second etch stop layer 24 and third interlayer dielectric film 26 made of a low dielectric material are stacked sequentially on and/or over lower metal wire 18 and first interlayer dielectric film 16. Novolac 28 is buried in a via hole formed in interlayer dielectric films 22 and 26 and second etch stop film 24.

As shown in FIG. 1B, a blanket etching is performed to remove a portion of novolac 28 such that another portion of novolac 28A remaining in the via hole. Photoresist pattern 32 is formed on and/or over third interlayer dielectric film 26 and an etching is then performed using photoresist pattern 32 as a mask, thereby forming a trench between third interlayer dielectric film patterns 26A and a via hole. Novolac 28 is not completely buried in the via hole due to the defects generated in burying novolac 28 caused by a gas condensation, coating of novolac 28 or particles flowed during ashing, such that novolac 28 may generate void 30. As shown in FIG. 1B, while the trench is formed, capping layer 20 fails to endure and thus is broken or removed to expose lower metal wire 18 such that oxidation 34 of the exposed copper metal wire 18 may be caused.

As shown in FIG. 1C, when upper metal wire 38 is buried in the trench and via hole, a problem arises in that copper void 36 is caused by corrosion between upper metal wire 38 and lower metal wire 18. Accordingly, since a general dual damascene process forms a via hole and a trench using novolac 28, capping layer 20 is broken or removed so that oxide film 34 (CuO/Cu2O) is formed on and/or over lower metal wiring composed of copper 18 and at the exposed interface between a via and lower metal wire 18. Thereby, a phenomenon of fatal copper corrosion and copper void(s) results. This in turn, causes a problem in reliability such as an earlier defect and stress migration (SM)/electro migration (EM) of a device.

SUMMARY

Embodiments relate to a method for manufacturing a semiconductor device that can form a metal wire using a hard mask without using a novolac.

Embodiments relate to a method for manufacturing a semiconductor device that may include at least one of the following: forming a first interlayer dielectric film, an etch stop film, a second interlayer dielectric film, and first and second hard mask layers sequentially on and/or over a lower metal wire; forming a second hard mask pattern by patterning the second hard mask layer so that a trench region is exposed; forming a first hard mask pattern by patterning the first hard mask layer so that a via hole is exposed; etching the second interlayer dielectric film and the etch stop film in the via region using the first hard mask pattern as a mask until the first interlayer dielectric film is exposed; forming a trench by etching the first hard mask pattern and the second interlayer dielectric film in the trench region using the second hard mask pattern as a mask until the etch stop layer is exposed, and forming a via hole by etching the first interlayer dielectric film in the via region using the etch stop layer as a mask until the lower metal wire is exposed; and forming an upper metal wire by gap-filling the trench and via hole with a metal material.

Embodiments relate to a method that may include at least one of the following: forming a first interlayer dielectric film, an etch stop film, a second interlayer dielectric film, and first and second hard mask layers sequentially over a lower metal wire; and then forming a second hard mask pattern by patterning the second hard mask layer exposing a portion of the first hard mask layer in a trench region; and then forming a first hard mask pattern by patterning the first hard mask layer exposing the second interlayer dielectric layer in a via hole regions; and then etching the second interlayer dielectric film and the etch stop film in the via hole regions using the first hard mask pattern as a mask thereby exposing the first interlayer dielectric film; and then forming a trench by etching the first hard mask pattern and the second interlayer dielectric film in the trench region using the second hard mask pattern as a mask thereby exposing the etch stop layer; and then forming via holes by etching the first interlayer dielectric film in the via hole regions using the etch stop layer as a mask thereby exposing the lower metal wire; and then forming an upper metal wire by filling the trench and the via holes with a metal material.

Embodiments relate to a method that may include at least one of the following: forming a lower metal structure; and then forming a capping layer over the lower metal structure; and then sequentially forming a first dielectric film, an etch stop film, a second dielectric film, a first hard mask layer and a second hard mask layer over the capping layer; and then forming a second hard mask pattern exposing a portion of the first hard mask layer; and then forming a first hard mask pattern exposing portions of the second dielectric film; and then etching the exposed portions of the second dielectric film and the etch stop film in the via hole regions using the first hard mask pattern as a mask thereby exposing portions of the first dielectric film; and then forming a trench by etching the first hard mask pattern and the second dielectric film in using the second hard mask pattern as a mask thereby exposing the etch stop layer; and then forming via holes by etching the first dielectric film using the etch stop layer as a mask thereby exposing the lower metal structure; and then performing a hydrogen plasma treatment on the exposed lower metal structure; and then forming a diffusion barrier film over the walls of the trench and via holes; and then forming an upper metal structure in the trench and the via holes.

Embodiments relate to a method that may include at least one of the following: forming a lower metal structure over a substrate; and then forming a first dielectric film over the lower metal structure, the first dielectric film including a first silicon-rich oxide (SRO) layer formed over the lower metal structure and a first dielectric layer having a low-k value formed over the first SRO layer; and then forming an etch stop film over the first dielectric film; and then forming a second dielectric film over the etch stop film, the second dielectric film including a second SRO layer formed over the etch stop film, a second dielectric layer having a low-k value formed over the second SRO layer and a third SRO layer formed over the second dielectric layer; and then sequentially forming a first hard mask layer and a second hard mask layer over the second dielectric film; and then forming a second hard mask pattern exposing a portion of the first hard mask layer; and then forming a first hard mask pattern exposing portions of the second dielectric film; and then etching the exposed portions of the second dielectric film and the etch stop film using the first hard mask pattern as a mask thereby exposing portions of the first dielectric film; and then forming a trench by etching the first hard mask pattern and the second dielectric film in using the second hard mask pattern as a mask thereby exposing the etch stop layer; and then forming via holes by etching the first dielectric film using the etch stop layer as a mask thereby exposing the lower metal structure; and then performing a hydrogen plasma treatment on the exposed lower metal structure; and then forming a diffusion barrier film over the walls of the trench and via holes; and then forming an upper metal structure in the trench and the via holes.

DRAWINGS

FIGS. 1A to 1C illustrate a method for manufacturing a semiconductor device.

Example FIGS. 2A to 2J illustrate a method for manufacturing a semiconductor device in accordance with embodiments.

DESCRIPTION

Example FIGS. 2A to 2J are cross-sectional views showing processes of a method for manufacturing a semiconductor device in accordance with embodiments.

Figure 2A:
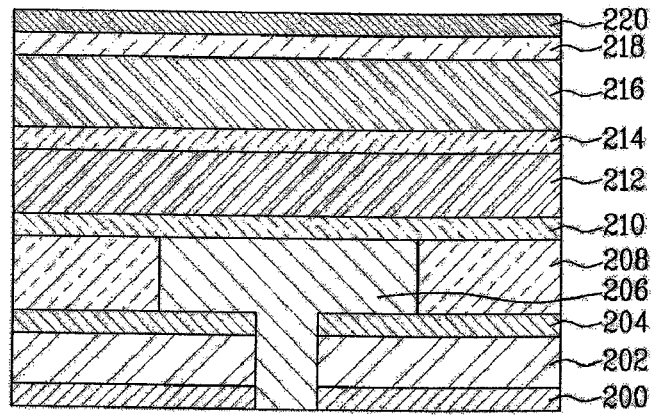

Referring to example FIG. 2A, lower metal wiring 206 is formed extending through capping layer 200, interlayer dielectric film 202 and interlayer dielectric film 208. Then, capping layer 210, interlayer dielectric film 212, etch stop layer 214, interlayer dielectric film 216, and first mask layer 218 and second mask layer 220 are stacked sequentially on and/or over lower metal wire 206. In other words, as described to be later, a semiconductor device shown in example FIG. 2J may be formed in a form that the same pattern is repeatedly stacked vertically.

In accordance with embodiments, capping layer 210 may be formed selectively. Interlayer dielectric film 208, etch stop film 204, interlayer dielectric film 202 and capping layer 200 may each be composed of the same material as interlayer dielectric films 212, 216, etch stop film 214 and capping layer 210, respectively. For instance, lower metal wire 206 may be made of copper, and capping layer 210 and etch stop film 212 may be made of a nitride film, respectively. Capping layer 210 may be made of silicon nitride (SiN) using a Plasma Enhanced Chemical Vapor Deposition (PECVD) method. Capping layer 210 serves to prevent lateral copper (Cu) diffusion of lower metal wire 206. Etch stop film 214 may be made of silicon oxy-nitride (SiON) and serves to prevent copper fencing and also prevent interlayer dielectric film 212 from being etched when interlayer dielectric film 216 is etched in order to form a trench, as shown in example FIG. 2G In order to form interlayer dielectric film 212, after a silicon-rich oxide (SRO) layer is formed on and/or over capping layer 210, a low-k interlayer dielectric layer may be formed on and/or over the SRO layer. The low-k interlayer dielectric layer refers to material having a low-dielectric constant. In this manner, interlayer dielectric film 212 may be formed in a multi-layered structure such that the SRO layer and the low-k interlayer dielectric layer are stacked. In order to form interlayer dielectric film 216, after a second SRO layer is formed on and/or over etch stop film 214, a second low-k interlayer dielectric layer is formed on and/or over the first SRO and then a third SRO layer is formed on and/or over the low-k interlayer dielectric layer. In this manner, interlayer dielectric film 216 may be formed in a multi-layered structure such that the second SRO layer, the second low-k interlayer and the third SRO layer are stacked.

First hard mask layer 218 and second hard mask layer 220 may be made of $SiON_x$ and $SiON_y$ ($x \neq y$), respectively. In other words, the first and second hard mask layers 218 and 220 are formed having different nitrogen ratio for silicon component in order to have an etching selectivity for interlayer dielectric film 216. Here, y is larger than x. For example, x may be in a range between approximately 2 to 6 and y may be in a range between approximately 3 to 9. For example, x may be 4 and y may be 6. In accordance with embodiments, first and second hard mask layers 218 and 220 may be formed on and/or over interlayer dielectric film 216 by differing $N_2$ flow of SiON through an ex-situ process two times. Both first hard mask layer 218 and second hard mask layer 220 may be deposited using a Plasma Enhanced Chemical Vapor Deposition (PECVD) method.

Figure 2B:
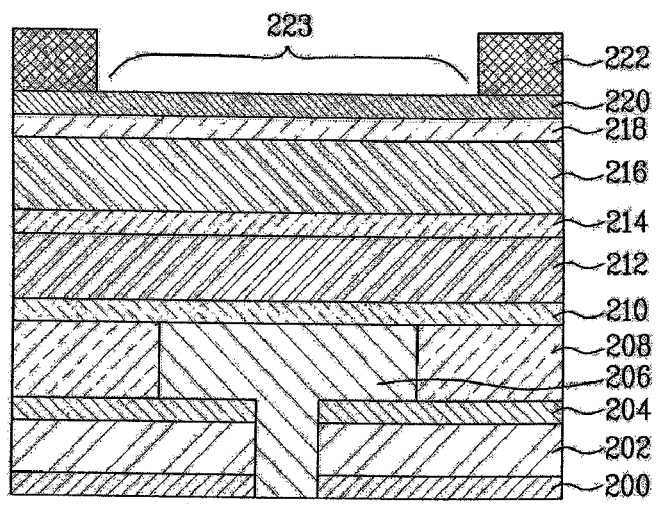
Figure 2C:
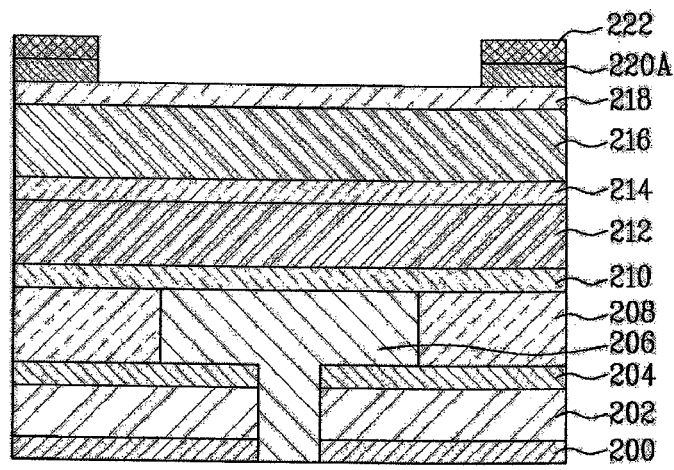

As shown in example FIG. 2B, photoresist pattern 222 which exposes trench region 223 is formed on and/or over second hard mask layer 220 using a lithograph process. As shown in example FIG. 2C, a dry etching is performed on second hard mask layer 220 using photoresist pattern 222 as a mask to form second hard mask pattern 220A. In this manner, after second hard mask pattern 220A is formed, photoresist pattern 222 is removed.

Figure 2D:
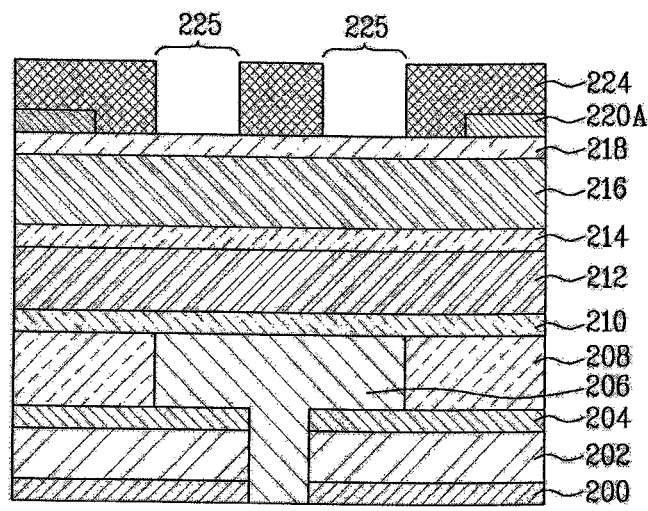
Figure 2E:
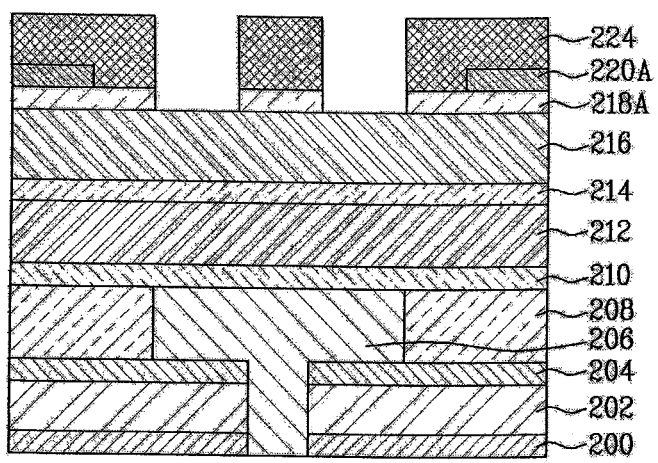

As shown in example FIG. 2D, photoresist film pattern 224 which exposes a via region 225 is formed on and/or over second hard mask pattern 220A and first hard mask layer 218 using a lithography process. As shown in example FIG. 2E, a dry etching is performed on first hard mask layer 218 using photoresist film pattern 224 as a mask to form first hard mask pattern 218A. After first hard mask pattern 218A is formed, photoresist film pattern 224 is removed.

Figure 2F:
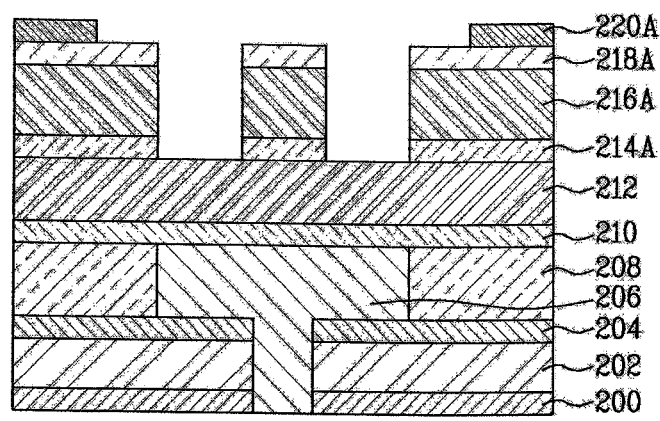
Figure 2G:
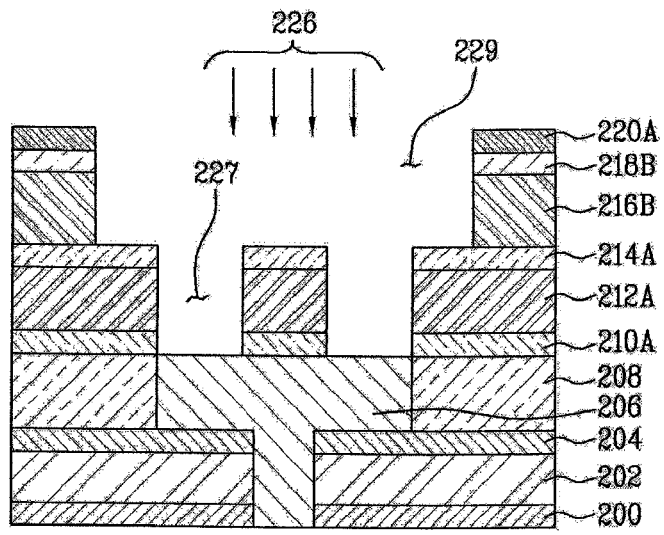

As shown in example FIG. 2F, respective portions of interlayer dielectric film 216 and etch stop film 214 in via region 225 are etched using first hard mask pattern 218A as a mask until interlayer dielectric film 212 is exposed. The etching selectivity between first hard mask pattern 218A and interlayer dielectric film 216 is set in a range between approximately 1:10 to 1:20 so that etch stop film 214 can be removed sufficiently. Therefore, holes for forming via hole 227 are formed temporarily extending through first hard mask pattern 218A, interlayer dielectric film 216A and etch stop film 214A.

As shown in example FIG. 2Q first hard mask pattern 218A and interlayer dielectric film 216A in trench region 223 are etched using second hard mask pattern 220A as a mask until etch stop film 214A is exposed, thereby forming trench 229 between interlayer dielectric film patterns 216B. For example, when trench 229 is formed, interlayer dielectric film 216A may be etched to etch stop layer 214A using an End Point Detection (EPD) signal through a time etching condition. At this time, interlayer dielectric film 212 and capping layer 210 in via region 225 are etched using an in-situ process using etch stop film 214A as a mask until lower metal wire 206 is exposed, thereby forming via hole 227 extending through etch stop film 214A, interlayer dielectric film 212A and capping layer 210A. In accordance with embodiments, via hole 227 is formed after trench 29 is formed. Thereafter, in order to prevent oxidation of lower wire metal 206 exposed after trench 229 and via hole 227 are formed, hydrogen ($H_2$) plasma treatment 226 is performed. A CuO or $Cu_2O$ based native oxide film, which is a result of oxidation of the exposed copper of lower metal wire 206 through the plasma treatment, may be removed. In other words, the hydrogen ($H_2$) in the plasma treatment 226 reacts with the oxygen component of the native oxide film which is evaporated into a hydroxide OH group. Finally, in accordance with embodiments, when forming trench 229, via hole 227 is formed by etching capping layer 210, not using the novolac, making it possible to solve the side-effect resulting from the defect generated in burying the novolac due to the side-effect inn a process integration. In order to prevent the oxidation of lower metal wire 206 made of copper after trench 229 and via hole 227 are formed, a delay time between subsequent processes may be managed within two hours.

Figure 2H:
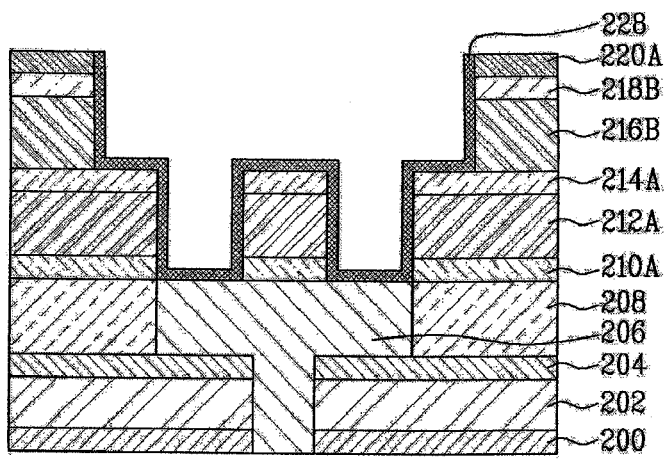

As shown in example FIG. 2H, diffusion barrier film 228 is formed on and/or over walls of trench 229 and via hole 227 using an in-situ process. Diffusion barrier film 228 serves to prevent the metal component of upper metal wire 230A to be formed later from being diffused into interlayer dielectric films 212A and 216B. Diffusion barrier film 228 may be made of Ta/TaN or the like.

Figure 2I:
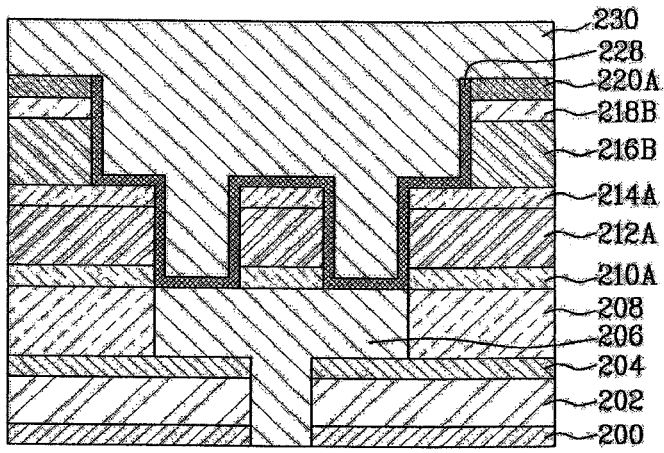
Figure 2J:
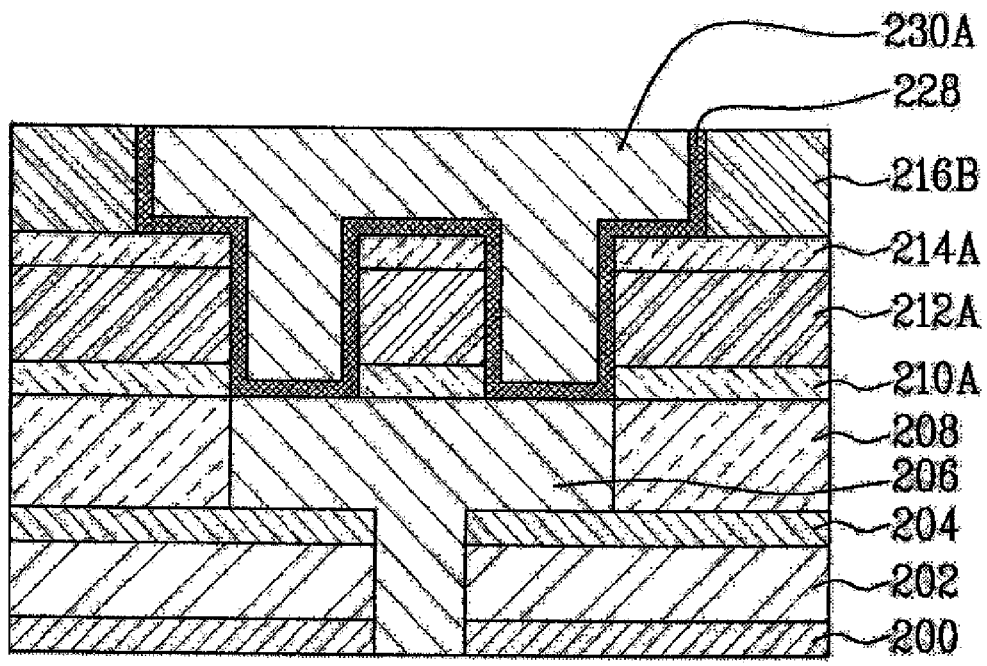

As shown in example FIG. 2I, trench 229 and via hole 228 on and/or over which diffusion barrier film 228 is formed are gap-filled with metal material 230 such as copper through Electric Chemical Plating (ECP) process as an example. As shown in example FIG. 2J, a planarization is performed until first and second hard mask patterns 220A and 218B are removed to expose interlayer dielectric film 216B, thereby forming upper metal wire 230A. In order to perform a planarization, a Chemical Mechanical Polishing (CMP) may be used. In order to remove first and second hard mask patterns 220A and 218B, the CMP may be performed on the condition that slurry (and additives) capable of removing hard mask patterns 220A and 218B and metal material 230 at the same etching selectivity are used. Since first and second hard mask patterns 220A and 218B have a high dielectric constant (high-k) in a range between approximately 6 to 7, it is preferable that first and second hard mask patterns 220A and 218B are removed, as shown in FIG. 2J.

As described above, with the method for manufacturing the semiconductor device in accordance with embodiments, an upper metal wire is formed using two hard mask patterns, and thus, does not use a novolac, during a low-k material/copper dual damascene process. Therefore, it is possible to prevent defects of a device due to the deterioration of Electro Migration (EM)/Stress Migration (SM) properties of the device due to the copper corrosion and void generated in burying the novolac. A nitride film is used as an etch stop layer, making it possible to prevent the generation of the fencing phenomenon of the metal copper wire when the etching process is performed for a trench.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
sequentially forming a first interlayer dielectric film, an etch stop film, a second interlayer dielectric film, and first and second hard mask layers over a lower metal wire; and then forming a second hard mask pattern by patterning the second hard mask layer exposing a portion of the first hard mask layer in a trench region; and then forming a first hard mask pattern by patterning the first hard mask layer exposing the second interlayer dielectric layer in a via hole regions; and then etching the second interlayer dielectric film and the etch stop film in the via hole regions using the first hard mask pattern as a mask thereby exposing the first interlayer dielectric film; and then forming a trench by etching the first hard mask pattern and the second interlayer dielectric film in the trench region using the second hard mask pattern as a mask thereby exposing the etch stop layer; and then forming via holes by etching the first interlayer dielectric film in the via hole regions using the etch stop layer as a mask thereby exposing the lower metal wire; and then forming an upper metal wire in the trench and the via holes, wherein forming the second interlayer dielectric film comprises:

forming a first silicon-rich oxide (SRO) layer over the etch stop film; and then forming an interlayer dielectric layer having a low-k value over the first SRO layer; and then forming a second SRO layer over the interlayer dielectric layer.

2. The method of claim 1, further comprising, before sequentially forming the first interlayer dielectric film, the etch stop film, the second interlayer dielectric film, and the first and second hard mask layers:

forming a capping layer over the lower metal wire, wherein the capping layer in the via hole regions is etched when the via holes are formed.

3. The method of claim 2, wherein the capping layer comprises a nitride material.

4. The method of claim 1, further comprising, after forming the via holes:

performing a hydrogen plasma treatment on the exposed lower metal wire.

5. The method of claim 1, further comprising, before forming the upper metal wire:

forming a diffusion barrier film over the walls of the trench and via holes.

6. The method of claim 1, wherein the etch stop layer comprises a nitride material.

7. The method of claim 1, wherein forming the first interlayer dielectric film comprises:

forming a silicon-rich oxide (SRO) layer over the lower metal wire; and then forming an interlayer dielectric layer having a low-k value over the SRO layer.

8. The method of claim 1, wherein the first hard mask layer and second hard mask layer are made of $SiON_x$ and $SiON_y$, respectively.

9. The method of claim 8, wherein $x \neq y$.

10. The method of claim 8, wherein the first and second hard mask layers are formed by performing an in-situ process two separate times using two different $N_2$ flow rates in the formation of the SION layers.

11. The method of claim 8, wherein x is larger than y.

12. The method of claim 8, wherein x is in a range between approximately 2 to 6 and y is in a range between approximately 3 to 9.

13. The method of claim 1, wherein the etching selectivity between the first hard mask pattern and the second interlayer dielectric film is in a range between approximately 1:10 to 1:20.

14. The method of claim 1, wherein forming the upper metal wire comprises:

filling the trench and via hole with a metal material; and then performing a planarization process until the first and second hard mask patterns are removed to expose the second interlayer dielectric film.

15. A method comprising:

forming a lower metal structure; and then forming a capping layer over the lower metal structure; and then sequentially forming a first dielectric film, an etch stop film, a second dielectric film, a first hard mask layer and a second hard mask layer over the capping layer; and then forming a second hard mask pattern exposing a portion of the first hard mask layer; and then forming a first hard mask pattern exposing portions of the second dielectric film; and then etching the exposed portions of the second dielectric film and the etch stop film in the via hole regions using the first hard mask pattern as a mask thereby exposing portions of the first dielectric film; and then forming a trench by etching the first hard mask pattern and the second dielectric film in using the second hard mask pattern as a mask thereby exposing the etch stop layer; and then forming via holes by etching the first dielectric film using the etch stop layer as a mask thereby exposing the lower metal structure; and then performing a hydrogen plasma treatment on the exposed lower metal structure; and then forming a diffusion barrier film over the walls of the trench and via holes; and then forming an upper metal structure in the trench and the via holes, wherein forming the second dielectric film comprises:

forming a first silicon-rich oxide (SRO) layer over the etch stop film; and then forming a dielectric layer having a low-k value over the first SRO layer; and then forming a second SRO layer over the dielectric layer.

16. The method of claim 15, wherein the capping layer and the etch stop layer each comprise a nitride material.

17. The method of claim 15, wherein forming the first dielectric film comprises:

forming a silicon-rich oxide (SRO) layer over the capping layer; and then forming a dielectric layer having a low-k value over the SRO layer.

18. A method comprising:

forming a lower metal structure over a substrate; and then forming a first dielectric film over the lower metal structure, the first dielectric film including a first silicon-rich oxide (SRO) layer formed over the lower metal structure and a first dielectric layer having a low-k value formed over the first SRO layer; and then forming an etch stop film over the first dielectric film; and then forming a second dielectric film over the etch stop film, the second dielectric film including a second SRO layer formed over the etch stop film, a second dielectric layer having a low-k value formed over the second SRO layer and a third SRO layer formed over the second dielectric layer; and then sequentially forming a first hard mask layer and a second hard mask layer over the second dielectric film; and then forming a second hard mask pattern exposing a portion of the first hard mask layer; and then forming a first hard mask pattern exposing portions of the second dielectric film; and then etching the exposed portions of the second dielectric film and the etch stop film using the first hard mask pattern as a mask thereby exposing portions of the first dielectric film; and then forming a trench by etching the first hard mask pattern and the second dielectric film in using the second hard mask pattern as a mask thereby exposing the etch stop layer; and then forming via holes by etching the first dielectric film using the etch stop layer as a mask thereby exposing the lower metal structure; and then performing a hydrogen plasma treatment on the exposed lower metal structure; and then forming a diffusion barrier film over the walls of the trench and via holes; and then forming an upper metal structure in the trench and the via holes.

* * * * *